(12) United States Patent
Ito et al.

(10) Patent No.: US 11,164,693 B2
(45) Date of Patent: Nov. 2, 2021

(54) COIL COMPONENT AND ELECTRONIC DEVICE

(71) Applicant: TAIYO YUDEN CO., LTD., Tokyo (JP)

(72) Inventors: Satoshi Ito, Takasaki (JP); Shintaro Takahashi, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 404 days.

(21) Appl. No.: 16/175,417

(22) Filed: Oct. 30, 2018

(65) Prior Publication Data

US 2019/0172623 A1 Jun. 6, 2019

(30) Foreign Application Priority Data

Dec. 1, 2017 (JP) .............................. JP2017-231771
Jun. 29, 2018 (JP) .............................. JP2018-124047

(51) Int. Cl.
| | |
|---|---|
| *H01F 27/24* | (2006.01) |
| *H01F 27/28* | (2006.01) |
| *H01F 17/04* | (2006.01) |
| *H05K 1/18* | (2006.01) |
| *H01F 27/29* | (2006.01) |
| *H05K 3/34* | (2006.01) |

(52) U.S. Cl.
CPC .......... *H01F 27/24* (2013.01); *H01F 17/045* (2013.01); *H01F 27/2823* (2013.01); *H01F 27/2828* (2013.01); *H01F 27/292* (2013.01); *H05K 1/181* (2013.01); *H05K 3/3442* (2013.01); *H05K 2201/1003* (2013.01)

(58) Field of Classification Search
CPC ..................................................... H01F 27/323
USPC .......................................................... 336/221
See application file for complete search history.

(56) References Cited

U.S. PATENT DOCUMENTS

| | | | | |
|---|---|---|---|---|
| 8,438,720 | B2* | 5/2013 | Muneuchi | H01F 27/327 29/602.1 |
| 2003/0179062 | A1* | 9/2003 | Kuwata | H01F 17/045 336/83 |
| 2015/0002252 | A1 | 1/2015 | Masaki et al. | |
| 2018/0158597 | A1* | 6/2018 | Chiu | H01F 27/324 |

FOREIGN PATENT DOCUMENTS

| | | |
|---|---|---|
| JP | 2005191395 A | 7/2005 |
| JP | 2008124162 A | 5/2008 |
| JP | 2008218950 A | 9/2008 |

(Continued)

*Primary Examiner* — Ronald Hinson
(74) *Attorney, Agent, or Firm* — Law Office of Katsuhiro Arai

(57) ABSTRACT

In an exemplary embodiment, a coil component includes: a drum core 10 having a winding shaft 12 and a pair of flange parts 14a, 14b; and a coil 30 constituted by a conductive wire 34 with insulating sheath 38 being wound around the winding shaft 12, forming one or more layers 32 in a direction which crosses an axial direction of the winding shaft 12; wherein the conductive wire 34 is exposed to and faces, at each of the one or more layers 32, a void 64 formed between the flange part 14a and the flange part 14b, wherein the void 64 is present at each of the one or more layers 32 in succession from one end to the other end of the conductive wire 34 as viewed in the axial direction of the winding shaft 12.

11 Claims, 9 Drawing Sheets

(56) References Cited

FOREIGN PATENT DOCUMENTS

| | | |
|---|---|---|
| JP | 2015084405 A | 4/2015 |
| JP | WO2013146251 A1 | 12/2015 |
| JP | 2016134589 A | 7/2016 |

* cited by examiner

COIL COMPONENT AND ELECTRONIC DEVICE

BACKGROUND

Field of the Invention

The present invention relates to a coil component and an electronic device.

Description of the Related Art

Coil components, each comprising a drum core including a winding shaft and a pair of flange parts provided at both ends of the winding shaft, as well as a coil being wound around the winding shaft, are known (refer to Patent Literatures 1 and 2, for example). Also known are coil components, each having an exterior resin between the pair of flange parts of the drum core (refer to Patent Literatures 3 to 5, for example).

Background Art Literatures

[Patent Literature 1] Japanese Patent Laid-open No. 2005-191395
[Patent Literature 2] Japanese Patent Laid-open No. 2015-84405
[Patent Literature 3] Japanese Patent Laid-open No. 2016-134589
[Patent Literature 4] Japanese Patent Laid-open No. 2008-218950
[Patent Literature 5] Japanese Patent Laid-open No. 2008-124162

SUMMARY

As the temperature of a coil component rises, each part constituting the coil component undergoes thermal expansion according to the linear expansion coefficient of the material of the part. This means that the drum core may receive stress from the thermal expansion of each part constituting the coil component. The trend for smaller coil components in recent years is resulting in lower mechanical strengths of drum cores, particularly at their flange parts that are becoming increasingly thinner; this means that, as the drum core receives stress, the flange parts of the drum core may generate cracks.

The present invention was developed in light of the aforementioned problems, and its object is to reduce generation of cracks in the flange parts of the drum core.

Any discussion of problems and solutions involved in the related art has been included in this disclosure solely for the purposes of providing a context for the present invention, and should not be taken as an admission that any or all of the discussion were known at the time the invention was made.

The present invention is a coil component, comprising: a drum core including a winding shaft and a pair of flange parts provided at both ends of the winding shaft in an axial direction; and a coil constituted by a conductive wire with insulating sheath being wound around the winding shaft, and also having one or more layers, each formed by the conductive wire, in a direction which crosses the axial direction; wherein the conductive wire is in contact, in each of the one or more layers, with a first void formed in the axial direction with respect to the conductive wire; and the first void is provided, in each of the one or more layers, from one end to the other end of the conductive wire in the direction which crosses the axial direction.

In the aforementioned constitution, the first void may be provided between the conductive wire and at least one of the pair of flange parts.

In the aforementioned constitution, the conductive wire may be wound multiple turns around the winding shaft and arranged side by side in the axial direction, and the first void may be provided between the parts of the conductive wire arranged next to each other in the axial direction.

In the aforementioned constitution, a second void may be provided between the coil and the winding shaft.

In the aforementioned constitution, an exterior resin may be provided in a manner joining to the opposing faces of the pair of flange parts at the edges of the pair of flange parts, while also surrounding the outer periphery of the coil.

In the aforementioned constitution, the exterior resin may be joined to the opposing faces of the pair of flange parts and also to the side faces of the pair of flange parts.

In the aforementioned constitution, a third void may be provided between the coil and the exterior resin.

In the aforementioned constitution, the drum core may be formed by a magnetic metal, and the pair of flange parts may each have a thickness of 0.18 mm or less.

In the aforementioned constitution, the coil may include a wound part where the conductive wire is wound around the winding shaft to form the one or more layers, and lead parts where the conductive wire is led out to external electrodes from the wound part, and the wound part and at least one of the lead parts are in contact, in each of the one or more layers, with the first void formed in the axial direction with respect to the conductive wire.

The present invention is an electronic device comprising the aforementioned coil component and a circuit board on which the coil component is mounted.

According to the present invention, generation of cracks in the flange parts of the drum core can be reduced.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DESCRIPTION OF THE SYMBOLS

Figure 1A:
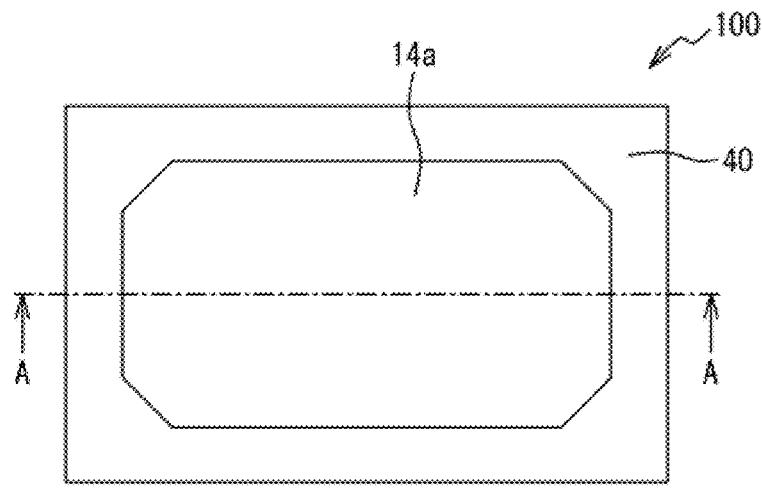
FIG. 1A is a plan view of the coil component pertaining to Example 1.

10 Drum core
12 Winding shaft
14a, 14b Flange part
30 Coil
32 Layer
34 Conductive wire
35 Wound part
36 Metal wire
37 Lead part
38 Insulating sheath
40 Exterior resin
50 External electrode
60 Inter-flange region
62 Demarcated region
64, 64a Void
66 Void
68 Void
80 Circuit board
82 Electrode
84 Solder
100 to 430 Coil component
500 Electronic device

DETAILED DESCRIPTION OF EMBODIMENTS

Examples of the present invention are explained below by referring to the drawings.

Example 1

Figure 1B:
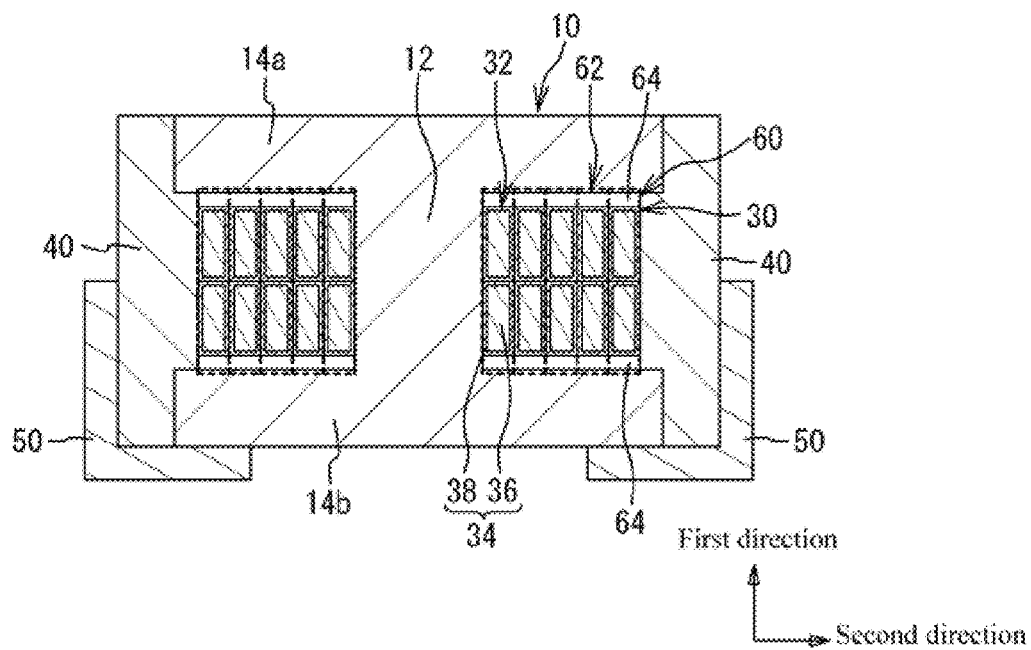
FIG. 1B is a cross-sectional view of A-A in FIG. 1A.

FIG. 1A is a plan view of the coil component pertaining to Example 1, and FIG. 1B is a cross-sectional view of A-A in FIG. 1A. As shown in FIGS. 1A and 1B, the coil component 100 in Example 1 is an inductor element comprising a drum core 10, a coil 30, an exterior resin 40, and external electrodes 50. The drum core 10 includes a winding shaft 12, and a pair of flange parts 14a, 14b provided at both ends of the winding shaft 12 in the axial direction. The winding shaft 12 has a columnar shape, for example. The flange parts 14a, 14b each have a prismatic shape with thickness in the axial direction of the winding shaft 12, for example. The bottom face of the winding shaft 12 has a diameter of approx. 0.8 mm, for example, and a height of approx. 0.5 mm, for example. Although the flange parts 14a, 14b have a thickness of approx. 0.18 mm, for example, miniaturization efforts may reduce their thickness to approx. 0.15 mm, while further miniaturization efforts may reduce their thickness to approx. 0.13 mm or even smaller, such as approx. 0.10 mm, in which cases the thickness becomes 0.18 mm or smaller. The bottom faces of the flange parts 14a, 14b are approx. 2.0 mm long in the long direction and approx. 1.2 mm long in the short direction, for example. It should be noted that the axial direction of the winding shaft 12 is hereinafter referred to as the first direction, while the direction crossing (at right angles, for example) the axial direction of the winding shaft 12 (e.g, a direction substantially perpendicular to the axial direction of the winding shaft 12) is hereinafter referred to as the second direction.

The drum core 10 is formed by a magnetic material. The drum core 10 is formed by, for example, a ferrite material, magnetic metal material, or resin containing magnetic metal grains. For example, the drum core 10 is formed by a Ni—Zn or Mn—Zn ferrite, Fe—Si—Cr, Fe—Si—Al, Fe—Si—Cr—Al, or other soft magnetic alloy, Fe, Ni or other magnetic metal, amorphous magnetic metal, nano-crystalline magnetic metal, or resin containing metal magnetic grains. If the drum core 10 is formed by a soft magnetic alloy, magnetic metal, amorphous magnetic metal, or nano-crystalline magnetic metal, the grains of any such metal may be insulation-treated.

In some embodiments, the drum core is constituted by a soft magnetic metal body which has a linear expansion coefficient higher than that of a ferrite body. In such a soft magnetic metal drum core, the distance between the pair of flange parts tends to be narrowed more significantly than in a ferrite drum core when the temperature of the drum core is increased. However, since the void is formed between the par of flange parts at each of the one or more layers, even when the drum core receives stress as a result of the dimension changes, the flange parts of the drum core can suppress generation of cracks.

The coil 30 is formed by a conductive wire 34 being wound around the winding shaft 12 of the drum core 10 in one layer or multiple layers. In other words, the coil 30 has one or more layers 32, each constituted by the conductive wire 34, stacked in the second direction. It should be noted that, if the conductive wire 34 is wound multiple turns around the winding shaft 12 in the first direction, as shown in FIG. 1B, it is deemed that the parts of the conductive wire 34 which are arranged side by side in the first direction together constitute a single layer 32. In FIG. 1B, the conductive wire 34 is wound five times around the winding shaft 12, and the coil 30 has five layers 32 stacked. The conductive wire 34 is constituted by a metal wire 36 and an insulating sheath 38 covering the surface of the metal wire 36. This means that, in FIG. 1B, the conductive wire 34 is wound around the winding shaft 12 in multiple layers with parts of the insulating sheath 38 contacting one another. Also, in FIG. 1B, the conductive wire 34 is wound around the winding shaft 12 side by side in the first direction, with parts of the insulating sheath 38 contacting one another. Examples of materials for the metal wire 36 include copper, silver, palladium, silver-palladium alloy, etc., while examples of materials for the insulating sheath 38 include polyester imide, polyamide, etc.

The conductive wire 34 is a rectangular wire whose cross-sectional shape is rectangular, for example; however, it may also be a round wire whose cross-sectional shape is circular, or the like. The cross-section of the conductive wire 34 has a long side of approx. 0.2 mm, for example, and a short side of approx. 0.07 mm, for example. The thickness of the insulating sheath 38 covering the metal wire 36 is approx. 0.005 mm, for example. As for the coil 30, the conductive wire 34 is wound around the winding shaft 12 of the drum core 10 according to the alpha winding method; however, it may be wound by any other winding method.

The exterior resin 40 is provided at the edges of the flange parts 14a, 14b of the drum core 10, in a manner joining to the opposing faces of the flange parts 14a, 14b and also to the side faces of the flange parts 14a, 14b. The exterior resin 40 is not provided on the faces of the flange parts 14a, 14b opposite the faces to which the winding shaft 12 is joined. The exterior resin 40 is provided in a manner surrounding the outer periphery of the coil 30, and not in the region where the conductive wire 34 is wound around the winding shaft 12 (region where the multiple layers 23 are provided). In other words, the coil 30 is not buried in the exterior resin 40. The exterior resin 40 is formed by a resin containing magnetic grains (such as epoxy resin containing ferrite), for example.

The external electrodes 50 are electrically connected to the coil 30, provided in a manner extending from the face of the flange part 14b opposite the face to which the winding shaft 12 is joined, to the side faces of the exterior resin 40. The lead part on one end of the coil 30 is connected to one of the pair of external electrodes 50, while the lead part on the other end of the coil 30 is connected to the other of the pair of external electrodes. The external electrodes 50 are each formed by a multilayer metal film constituted by a solder barrier layer and a solder wetting layer, provided, in this order, on a base layer, for example. Examples of materials for the base layer include copper, silver, palladium, silver-palladium alloy, etc. Examples of materials for the solder barrier layer include nickel, etc. Examples of materials for the solder wetting layer include tin, lead, tin-lead alloy, silver, copper, zinc, etc.

When an inter-flange region 60 between the flange parts 14a, 14b is demarcated into one or more demarcated regions 62 corresponding to one or more layers 32, respectively, a void 64 in contact with the conductive wire 34 is formed, in each of the one or more demarcated regions 62, between the conductive wire 34 and the flange part 14a or 14b. The void 64 is formed from one end to the other end of the demarcated region 62 in the second direction. Because the void 64 is formed from one end to the other end of all of one or more demarcated regions 62, it is present at one given position when viewed in the first direction, or at all positions from the innermost periphery end to the outermost periphery end of the conductive wire 34 when viewed in the second direction, between the flange part 14a and the flange part 14b. This means that, when a vertical line is drawn in the first direction between the flange part 14a and the flange part 14b in any location where the conductive wire 34 is present, the vertical line always traverses the conductive wire 34 and the void 64. When this position relationship is expressed by a position relationship of the conductive wire 34 and the void 64, the conductive wire 34 is described as contacting the void 64 formed between the conductive wire 34 and the flange part 14a or 14b in each of one or more layers 32. Because the void 64 is formed from one end to the other end of the conductive wire 34 in the second direction in each of one or more layers 32, the void 64 is always present between the conductive wire 34 and the flange part 14a or 14b in each of one or more layers 32, meaning that the conductive wire 34 and the flange part 14a or 14b are not in direct contact with each other. The length of the void 64 in the first direction (that is, the distance between the conductive wire 34 and the flange part 14a or 14b) is greater than the thickness of the insulating sheath 38, for example.

Figure 2A:
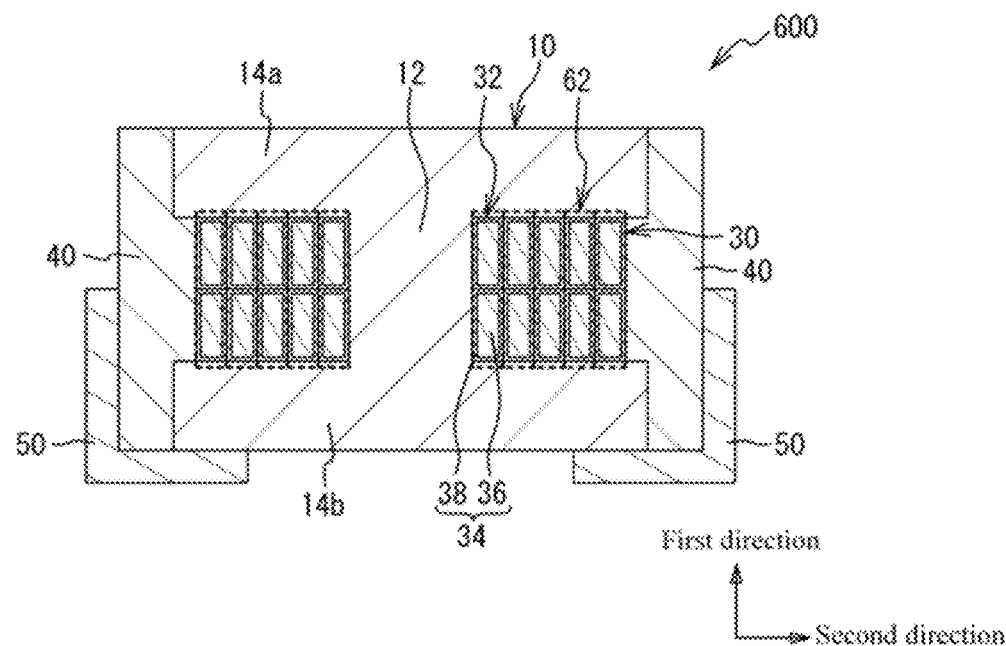
FIG. 2A is a cross-sectional view of the coil component pertaining to Comparative Example 1.
Figure 2B:
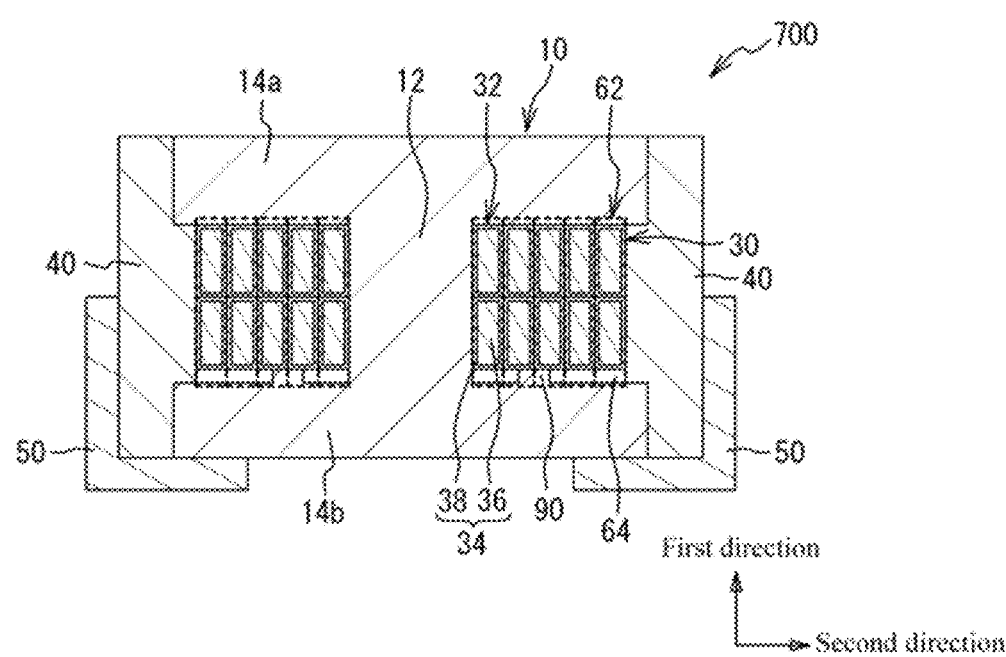
FIG. 2B is a cross-sectional view of the coil component pertaining to Comparative Example 2.

To explain the effects of the coil component 100 in Example 1, the coil components in comparative examples are explained. FIG. 2A is a cross-sectional view of the coil component pertaining to Comparative Example 1, and FIG. 2B is a cross-sectional view of the coil component pertaining to Comparative Example 2. As shown in FIG. 2A, the coil component 600 in Comparative Example 1 has no void formed between the conductive wire 34 and the flange parts 14a, 14b, with the conductive wire 34 and the flange parts 14a or 14b contacting each other, in each of the multiple demarcated regions 62. The remaining constitutions are the same as those of the coil component 100 in Example 1, and therefore not explained.

As shown in FIG. 2B, the coil component 700 in Comparative Example 2 has no void formed between the conductive wire 34 and the flange part 14a, with the conductive wire 34 and the flange parts 14a contacting each other, in each of the multiple demarcated regions 62. On the other hand, projecting parts 90 are provided on the face of the flange part 14b opposite the flange part 14a, with the conductive wire 34 contacting the projecting parts 90 in some layers 32 among the multiple layers 32. As a result of the conductive wire 34 contacting the projecting parts 90 in some layers 32, a void 64 is formed between the conductive wire 34 and the flange part 14b in the other layers 32 among the multiple layers 32. The remaining constitutions are the same as those of the coil component 100 in Example 1, and therefore not explained.

The temperature of a coil component may increase due to the use environment in which the coil component is used and/or environmental testing, etc., conducted to evaluate the reliability of the coil component. As the temperature of the coil component increases, each part constituting the coil component undergoes thermal expansion according to the linear expansion coefficient specific to the material of the part. In other words, the drum core 10, coil 30 and exterior resin 40 each have a different linear expansion coefficient and each undergo thermal expansion according to this specific linear expansion coefficient. For example, the linear expansion coefficient of the coil 30 is greater than that of the drum core 10 or exterior resin 40. If the drum core 10 is formed by metal magnetic grains and resin, the fill ratio of metal magnetic grains is determined by the quantity of resin, and preferably the quantity of resin is small. For instance, the linear expansion coefficient of the drum core 10 is approx. 15 PPM/° C., for example, when the percentage of resin in the drum core 10 is 5 percent by weight, and approx. 10 PPM/° C., for example, when the percentage of resin is 2 percent by weight. The coil 30 is formed using a conductive wire 34 that includes a metal wire 36 made of copper and an insulating sheath 38, for example. The insulating sheath 38 comes in various types, but because the linear expansion coefficient of copper is already 17 PPM/° C., adding the linear expansion coefficient of the insulating sheath 38 to it results in the conductive wire 34 having a greater linear expansion coefficient than the drum core 10. For example, the insulating sheath 38 may be made of polyurethane, polyester, polyester imide, etc., and although the specific value varies depending on the type, the linear expansion coefficient of the insulating sheath 38 itself is between 20 and 200 PPM/° C. The exterior resin 40 is formed by metal magnetic grains and resin and, as with the drum core 10, the fill ratio of metal magnetic grains is determined by the quantity of resin, and preferably the quantity of resin is small. However, preferably the percentage of resin in the exterior resin 40 is made higher than that in the drum core 10 to facilitate molding. For instance, the linear expansion coefficient of the exterior resin 40 is approx. 15 PPM/° C., for example, when the percentage of resin in the exterior resin 40 is 5 percent by weight, and approx. 30 PPM/° C., for example, when the percentage of resin is 10 percent by weight.

Now, if no void is formed between the coil 30 and the flange parts 14*a*, 14*b* and the conductive wire 34 is in contact with the flange parts 14*a*, 14*b*, as is the case of Comparative Example 1 in FIG. 2A, a thermal expansion of the conductive wire 34 may stress the flange parts 14*a*, 14*b* and generate cracks in the flange parts 14*a*, 14*b*. Particularly when the conductive wire 34 is densely wound, there is no place for stress to escape and consequently the effect of thermal expansion increases, thus making it easy for cracks to generate in the flange parts 14*a*, 14*b*. Also, if the coil 30 is partially contacting the projecting parts 90, as is the case of Comparative Example 2 in FIG. 2B, thermal expansion of the conductive wire 34 makes it easy for the projecting parts 90 to receive concentrated stress, which in turn makes it easy for cracks to generate in the flange part 14*b*.

According to Example 1, on the other hand, the conductive wire 34 is in contact with the void 64 formed between the conductive wire 34 and the flange parts 14*a*, 14*b* in each of one or more layers 32, as shown in FIG. 1B. The void 64 is formed from one end to the other end of the conductive wire 34 in the second direction in each of one or more layers 32. This can reduce the stress that may be applied to the flange parts 14*a*, 14*b* in the event that the conductive wire 34 undergoes thermal expansion due to a high temperature of the coil component 100. As a result, generation of cracks in the flange parts 14*a*, 14*b* can be reduced. Preferably the void 64 has a size that can reduce the stress applied to the flange parts 14*a*, 14*b*, and consequently reduce generation of cracks therein, even when the conductive wire 34 undergoes thermal expansion.

The conductive wire 34 is constituted by a metal wire 36, and an insulating sheath 38 covering the metal wire 36, in order to ensure withstand voltage. In light of this, thermal expansion of the conductive wire 34 may cause it to rub against the flange parts 14*a*, 14*b* and make the insulating sheath 38 thinner, and the withstand voltage may drop as a result, in Comparative Example 1 in FIG. 2A. In Example 1, on the other hand, rubbing of the conductive wire 34 against the flange parts 14*a*, 14*b* is reduced even when the conductive wire 34 undergoes thermal expansion, which in turn reduces thinning of the insulating sheath 38. Consequently, drop in withstand voltage can be reduced. If the drum core 10 is formed by a magnetic metal and the conductive wire 34 rubs against the flange parts 14*a*, 14*b*, thus making the insulating sheath 38 thinner, the withstand voltage tends to drop between the conductive wire 34 and the drum core 10. This means that, if the drum core 10 is formed by a magnetic metal, preferably the void 64 is provided. It should be noted that, although the conductive wire 34 is wound around the winding shaft 12 in such a way that parts of it are contacting and overlapping one another, the mutually contacting parts of the conductive wire 34 have the same linear expansion coefficient, and therefore it is rare that the insulating sheath 38 becomes thinner as a result of parts of the conductive wire 34 rubbing against one another, even when the temperature of the coil component 100 becomes high.

As shown in FIGS. 1A and 1B, preferably the exterior resin 40 is provided in a manner surrounding the outer periphery of the coil 30 while joining to the opposing faces of the flange parts 14*a*, 14*b* at the edges of the flange parts 14*a*, 14*b*. This way, intrusion of water into the coil 30 from the outside can be reduced. Also, by using a resin containing magnetic grains for the exterior resin 40, leakage of magnetic flux is reduced and the inductance properties can be improved as a result.

As shown in FIG. 1B, preferably the exterior resin 40 joins to the opposing faces of the flange parts 14*a*, 14*b* and also to the side faces of the flange parts 14*a*, 14*b*. This way, the exterior resin 40 is joined to the flange parts 14*a*, 14*b* in two directions—one in which it joins to the opposing faces of the flange parts 14*a*, 14*b*, and the other in which it joins to the side faces that cross (at right angles, for example) with the opposing faces—and this reduces separation of the exterior resin 40 from the flange parts 14*a*, 14*b* even when it undergoes thermal expansion, for example. It should be noted that, as shown in FIG. 1A, preferably the exterior resin 40 is joined to all of the side faces of the flange part 14*a* and all of the side faces of the flange parts 14*b*, in order to reduce its separation from the flange parts 14*a*, 14*b*. However, effects of reducing its separation can be achieved so long as the exterior resin 40 is joined to at least one side face of the flange part 14*a* and at least one side face of the flange part 14*b*. From the viewpoint of effectively reducing its separation, preferably the exterior resin 40 is joined to the side faces of the flange parts 14*a*, 14*b* in the long direction. Also, to make the coil component 100 smaller, preferably the amount of outward projection of the exterior resin 40 beyond the flange parts 14*a*, 14*b* is minimal. This means that, from the viewpoint of reducing the separation of the exterior resin 40 while also making the coil component 100 smaller, preferably the exterior resin 40 is joined to the two opposing side faces of the flange part 14*a* and the two opposing side faces of the flange part 14*b*.

As shown in FIG. 1B, preferably the exterior resin 40 is not provided on the faces of the flange parts 14*a*, 14*b* opposite the faces to which the winding shaft 12 is joined. This way, the coil component 100 can be made smaller.

Figure 3A:
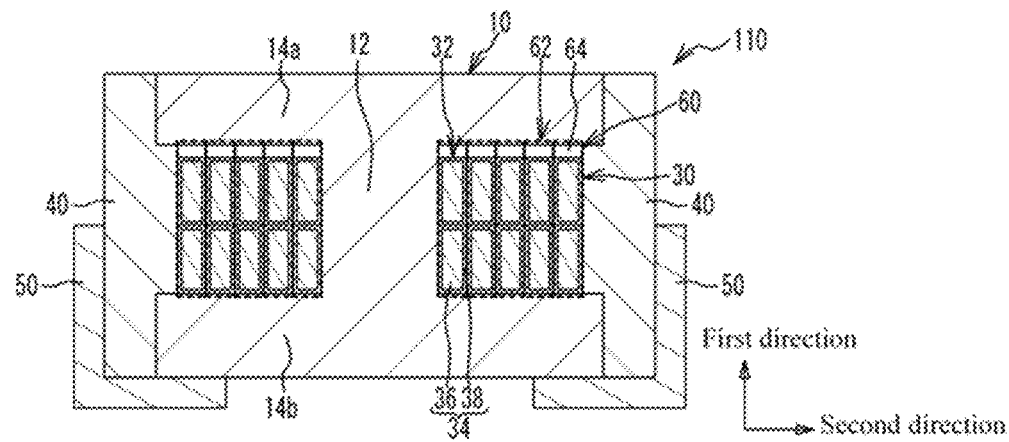
FIG. 3A is a cross-sectional view of the coil component pertaining to Variation Example 1 of Example 1.
Figure 3B:
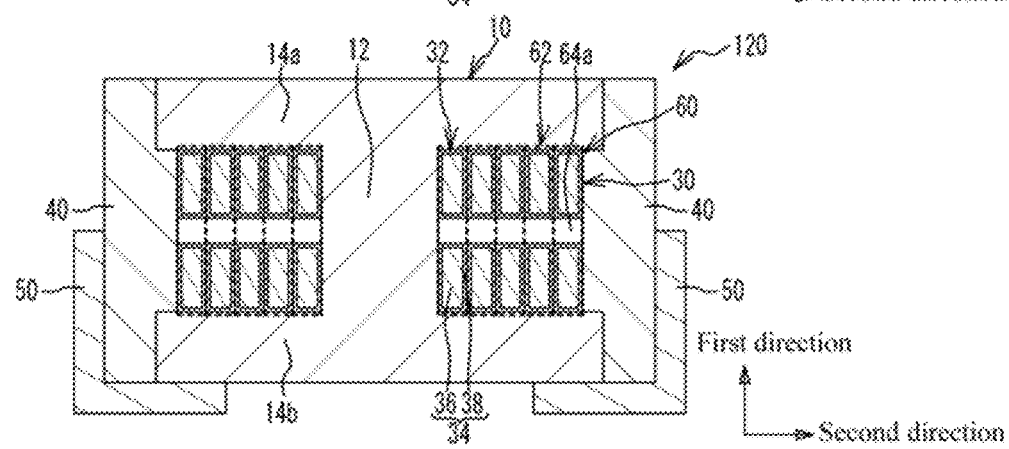
FIG. 3B is a cross-sectional view of the coil component pertaining to Variation Example 2 of Example 1.
Figure 3C:
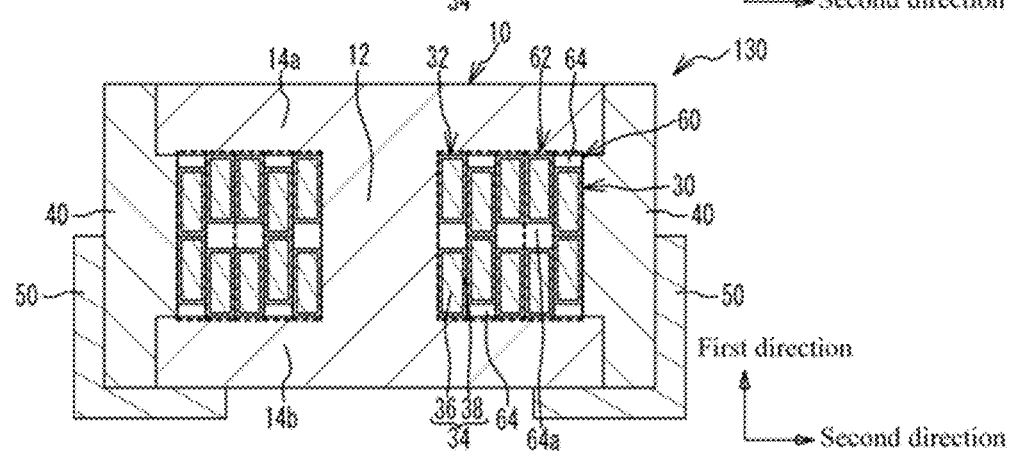
FIG. 3C is a cross-sectional view of the coil component pertaining to Variation Example 3 of Example 1.

FIG. 3A is a cross-sectional view of the coil component pertaining to Variation Example 1 of Example 1, FIG. 3B is a cross-sectional view of the coil component pertaining to Variation Example 2 of Example 1, and FIG. 3C is a cross-sectional view of the coil component pertaining to Variation Example 3 of Example 1. As shown in FIG. 3A, the coil component 110 in Variation Example 1 of Example 1 has a void 64 formed between the conductive wire 34 and the flange part 14*a*, but no such void 64 is formed between the conductive wire 34 and the flange part 14*b*, in each of one or more demarcated regions 62. In other words, the conductive wire 34 is in contact with the void 64 provided between the conductive wire 34 and the flange part 14*a*, while contacting the flange part 14*b* because no such void 64 is formed between the conductive wire 34 and the flange part 14*b*, in each of one or more layers 32. The remaining constitutions are the same as those in Example 1, and therefore not explained.

In Variation Example 1 of Example 1, the conductive wire 34 is in contact with the void 64 formed between the conductive wire 34 and the flange part 14*a* in each of one or more layers 32. This way, any stress applied to the flange part 14*a* can be mitigated, and thus generation of cracks in the flange part 14*a* can be reduced, even when the temperature of the coil component 110 becomes high and the conductive wire 34 undergoes thermal expansion. Based on Example 1 and Variation Example 1 of Example 1, preferably the void 64 is provided between the conductive wire 34 and at least one of the flange parts 14a, 14b, and preferably it is provided between the conductive wire 34 and both of the flange parts 14a, 14b, to reduce generation of cracks in the drum core 10.

As shown in FIG. 3B, the coil component 120 in Variation Example 2 of Example 1 has no void formed between the conductive wire 34 and the flange parts 14a, 14b in each of one or more demarcated regions 62. The conductive wire 34 is wound multiple turns around the winding shaft 12 and arranged side by side in the first direction, and in each of one or more demarcated regions 62, the conductive wire 34 is in contact with a void 64a formed between the parts of it that are arranged next to each other in the first direction. The void 64a is formed from one end to the other end of the demarcated region 62 in the second direction. In each of one or more layers 32, the parts of the conductive wire 34 that are arranged next to each other in the first direction are not contacting each other. The remaining constitutions are the same as those in Example 1, and therefore not explained.

According to Variation Example 2 of Example 1, the conductive wire 34 is in contact, in each of one or more layers 32, with the void 64a formed between the parts of the conductive wire 34 that are arranged next to each other in the first direction. The void 64a is formed from one end to the other end of the conductive wire 34 in the second direction in each of one or more layers 32. This means that, even when the temperature of the coil component 120 becomes high and the conductive wire 34 undergoes thermal expansion, the conductive wire 34 likely expands toward the void 64a and therefore any stress applied to the flange parts 14a, 14b is mitigated. As a result, generation of cracks in the flange parts 14a, 14b can be reduced.

As shown in FIG. 3C, the coil component 130 in Variation Example 3 of Example 1 has demarcated regions 62 where a void 64 is formed between the conductive wire 34 and the flange parts 14a, 14b, and demarcated regions 62 where a void 64a is formed between the parts of the conductive wire 34 that are arranged next to each other in the first direction. The remaining constitutions are the same as those in Example 1, and therefore not explained.

As shown in Variation Example 3 of Example 1, demarcated regions 62 where a void 64 is formed between the conductive wire 34 and the flange parts 14a, 14b, and demarcated regions 62 where a void 64a is formed between the parts of the conductive wire 34 that are arranged next to each other in the first direction, may coexist. In other words, it suffices that, in each of one or more demarcated regions 62, the conductive wire 34 is present at any given position between the flange part 14a and the flange part 14b and the void 64 is present at any given position between the flange part 14a and the flange part 14b.

Example 2

Figure 4:
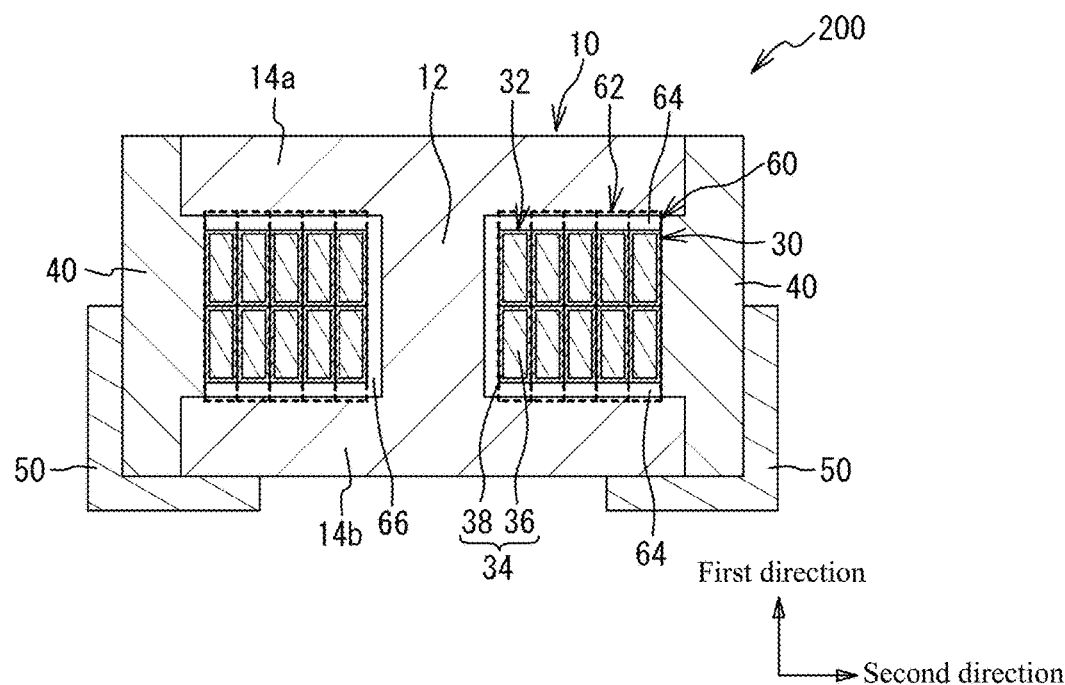
FIG. 4 is a cross-sectional view of the coil component pertaining to Example 2.

FIG. 4 is a cross-sectional view of the coil component pertaining to Example 2. As shown in FIG. 4, the coil component 200 in Example 2 has a void 66 formed between the coil 30 and the winding shaft 12 of the drum core 10. The remaining constitutions are the same as those in Example 1, and therefore not explained.

According to Example 2, the void 66 is provided between the coil 30 and the winding shaft 12 of the drum core 10. This means that, even when the temperature of the coil component 200 becomes high and the conductive wire 34 undergoes thermal expansion, any stress applied to the winding shaft 12 can be mitigated. As a result, generation of cracks in the winding shaft 12 can be reduced. Also, even when the conductive wire 34 undergoes thermal expansion, rubbing of the conductive wire 34 against the winding shaft 12 is reduced, and therefore any thinning of the insulating sheath 38 and consequent drop in the withstand voltage can be reduced.

Example 3

Figure 5:
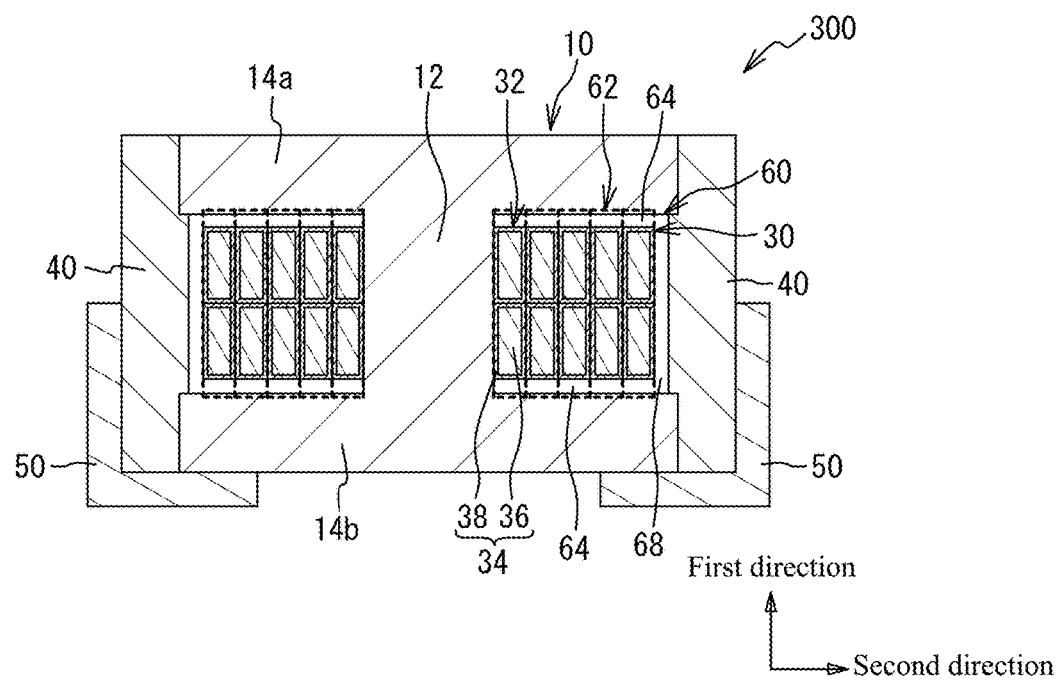
FIG. 5 is a cross-sectional view of the coil component pertaining to Example 3.

FIG. 5 is a cross-sectional view of the coil component pertaining to Example 3. As shown in FIG. 5, the coil component 300 in Example 3 has a void 68 formed between the coil 30 and the exterior resin 40. The remaining constitutions are the same as those in Example 1, and therefore not explained.

According to Example 3, the void 68 is provided between the coil 30 and the exterior resin 40. This means that, even when the temperature of the coil component 300 becomes high and the conductive wire 34 undergoes thermal expansion, rubbing of the conductive wire 34 against the exterior resin 40 is reduced, and therefore any thinning of the insulating sheath 38 and consequent drop in the withstand voltage can be reduced.

Example 4

Figure 6A:
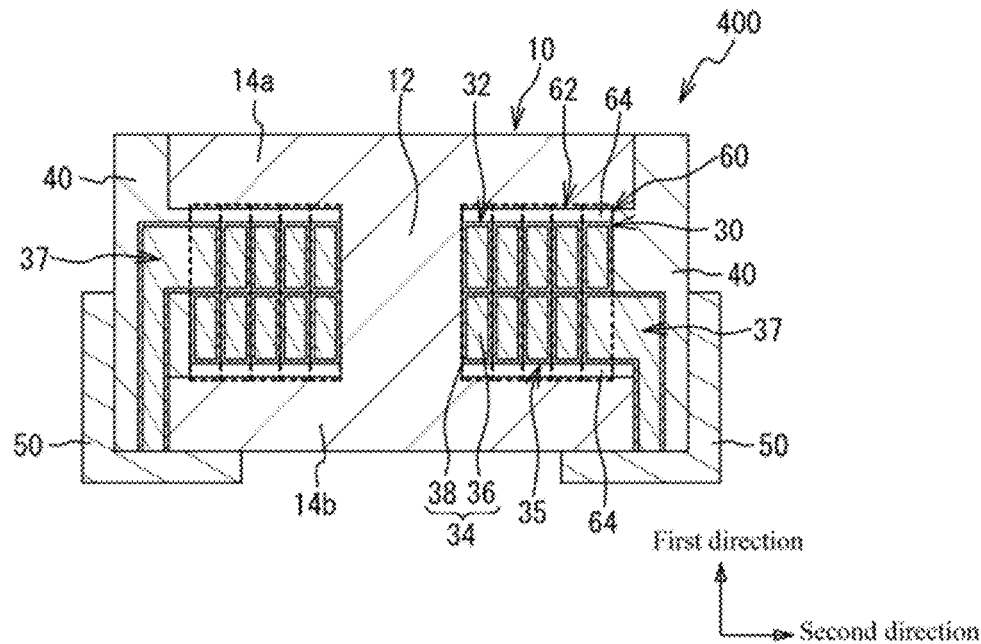
FIGS. 6A and 6B are cross-sectional views of the coil components pertaining to Example 4 and Variation Example 1 of Example 4, respectively.
Figure 6B:
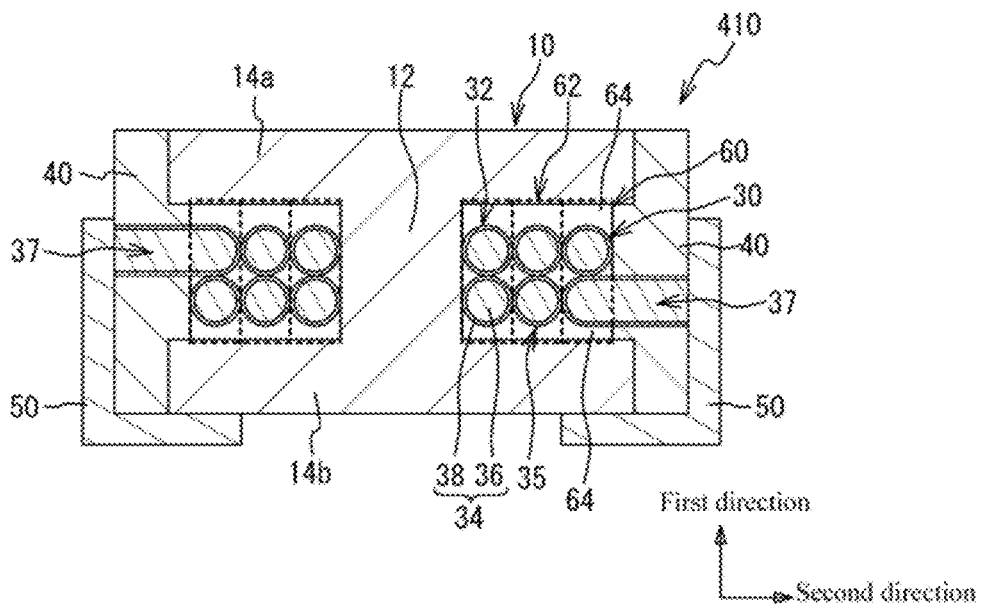
Figure 7A:
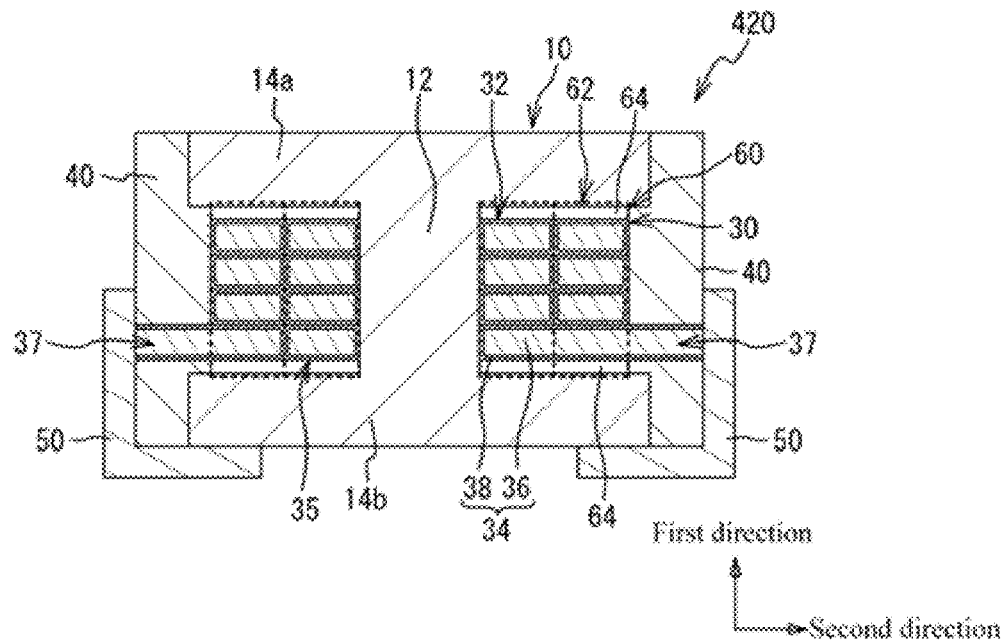
FIGS. 7A and 7B are cross-sectional views of the coil components pertaining to Variation Example 2 of Example 4 and Variation Example 3 of Example 4, respectively.
Figure 7B:
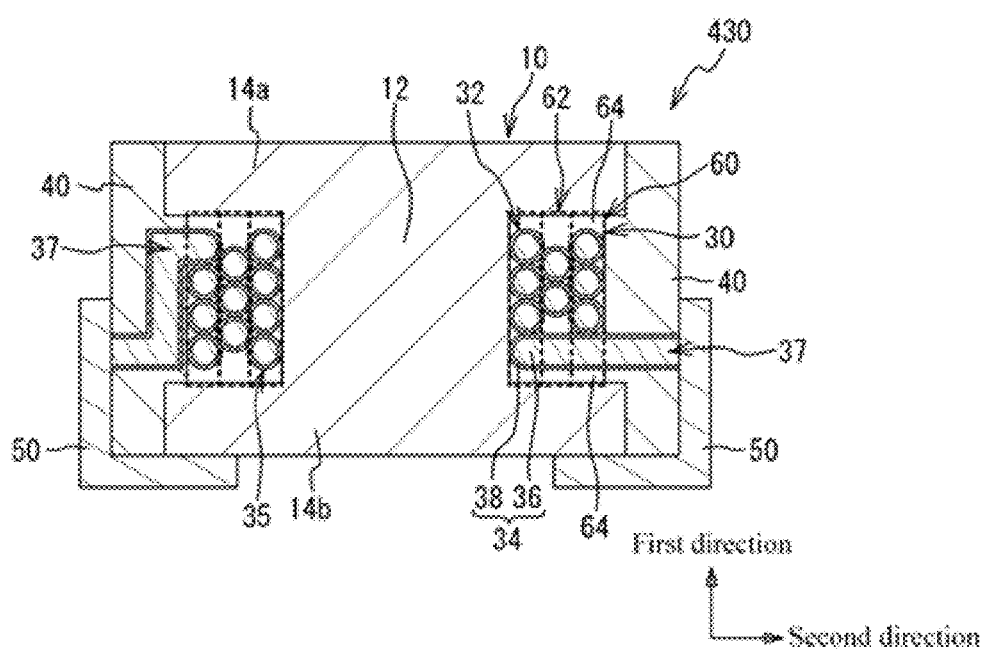

Examples 1 to 3 were explained through representation of cross-sectional views covering regions where the lead parts included in the coil 30 and led out to the external electrodes 50 are not provided. In Example 4, cross-sectional views covering regions where the lead parts included in the coil 30 are led out to the external electrodes 50 are shown. FIGS. 6A and 6B are cross-sectional views of the coil components pertaining to Example 4 and Variation Example 1 of Example 4, respectively. FIGS. 7A and 7B are cross-sectional views of the coil components pertaining to Variation Example 2 of Example 4 and Variation Example 3 of Example 4, respectively. As shown in FIG. 6A, the coil component 400 in Example 4 is such that a wound part 35, and lead parts 37, all included in the coil 30, are in contact with the void 64 formed between the conductive wire 34 and the flange parts 14a, 14b in each of one or more layers 32. The wound part 35 is a part where the conductive wire 34 is wound around the winding shaft 12, and forms one or more layers 32. The lead parts 37 are parts where the conductive wire 34 is led out to the external electrodes 50 from the wound part 35, and depending on its winding pattern, the conductive wire 34 is led out to each external electrode 50 from the innermost periphery part or outermost periphery part of winding. As is evident from the above, the lead parts 37 are each a part of the conductive wire 34 and therefore, depending on the winding pattern of the conductive wire 34, the wound part 35 and at least one of the lead parts 37, each of which is a part of the conductive wire 34, are in contact with the void 64 formed between the conductive wire 34 and the flange part 14a or 14b in each of one or more layers 32. The remaining constitutions are the same as those in Example 1, and therefore not explained.

As shown in FIG. 6B, the coil component 410 in Variation Example 1 of Example 4 is such that its conductive wire 34 is a round wire and both lead parts 37 are led out to the external electrodes 50 from the outermost periphery part of the wound part 35 (alpha-wound round wire), as opposed to the coil component 400 in Example 4 where the conductive wire 34 is a rectangular wire and both lead parts 37 are led out to the external electrodes 50 from the outermost periphery part of the wound part 35 (alpha-wound rectangular wire). The remaining constitutions are the same as those in Example 4, and therefore not explained. As shown in FIG. 7A, the coil component 420 in Variation Example 2 of Example 4 is such that its conductive wire 34 is a rectangular wire and one of the lead parts 37 is led out from the innermost periphery part of the wound part 35, while the other is led out from the outermost periphery part of the wound part 35, to the external electrodes 50, respectively. The remaining constitutions are the same as those in Example 4, and therefore not explained. As shown in FIG. 7B, the coil component 430 in Variation Example 3 of Example 4 is such that its conductive wire 34 is a round wire and one of the lead parts 37 is led out from the innermost periphery part of the wound part 35, while the other is led out from the outermost periphery part of the wound part 35, to the external electrodes 50, respectively. The remaining constitutions are the same as those in Example 4, and therefore not explained.

Figure 8A:
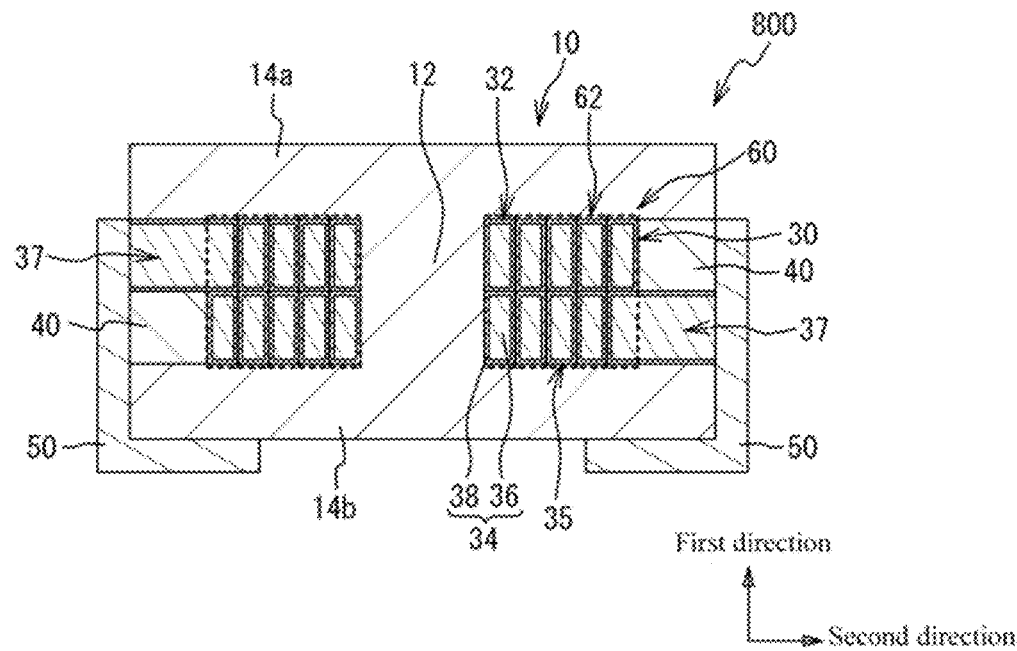
FIGS. 8A and 8B are cross-sectional views of the coil components pertaining to Comparative Examples 3 and 4, respectively.
Figure 8B:
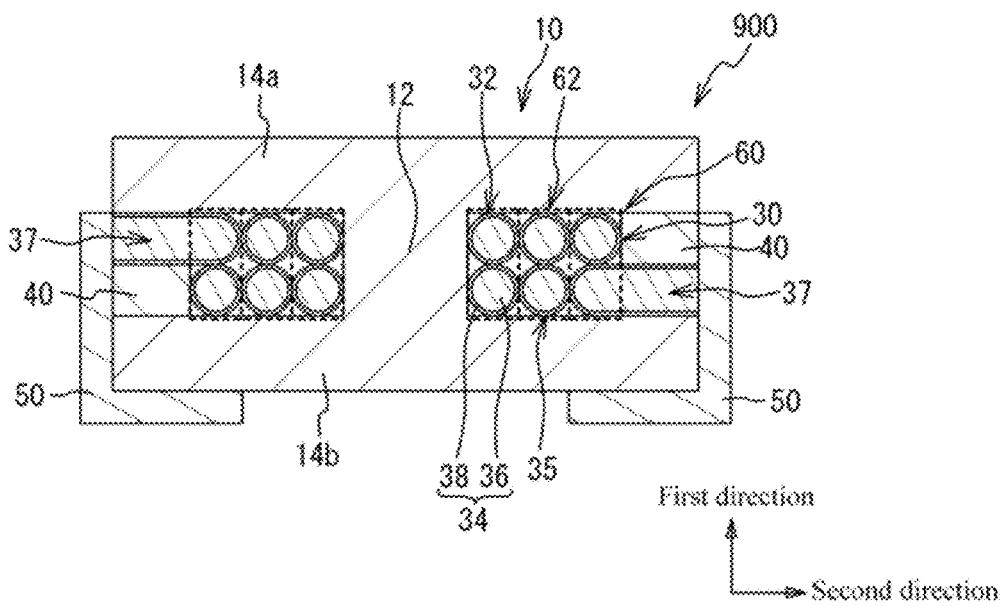
Figure 9A:
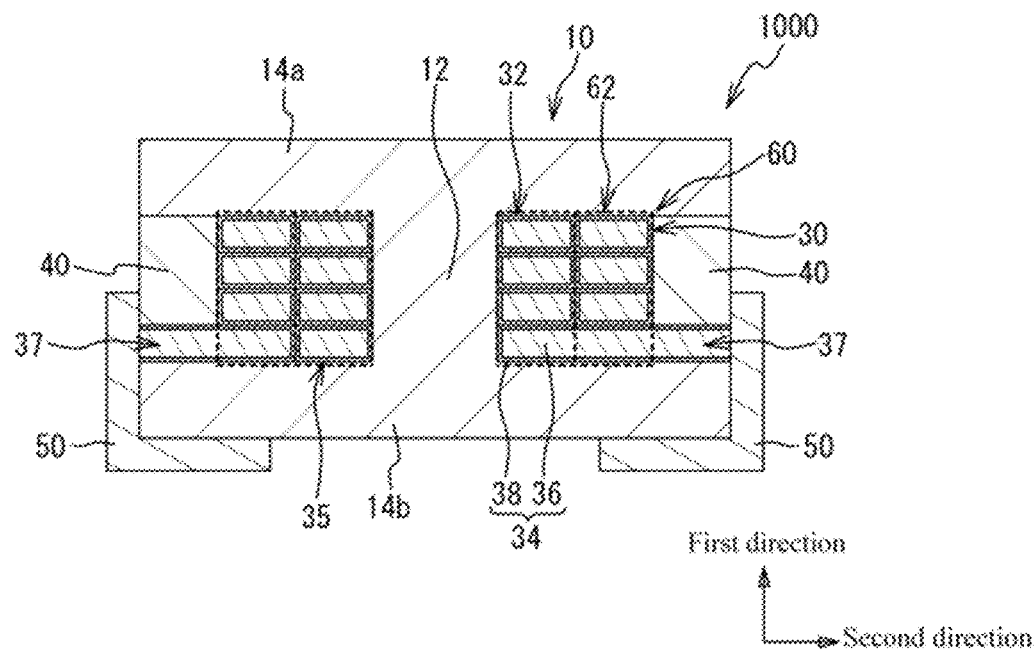
FIGS. 9A and 9B are cross-sectional views of the coil components pertaining to Comparative Examples 5 and 6, respectively.
Figure 9B:
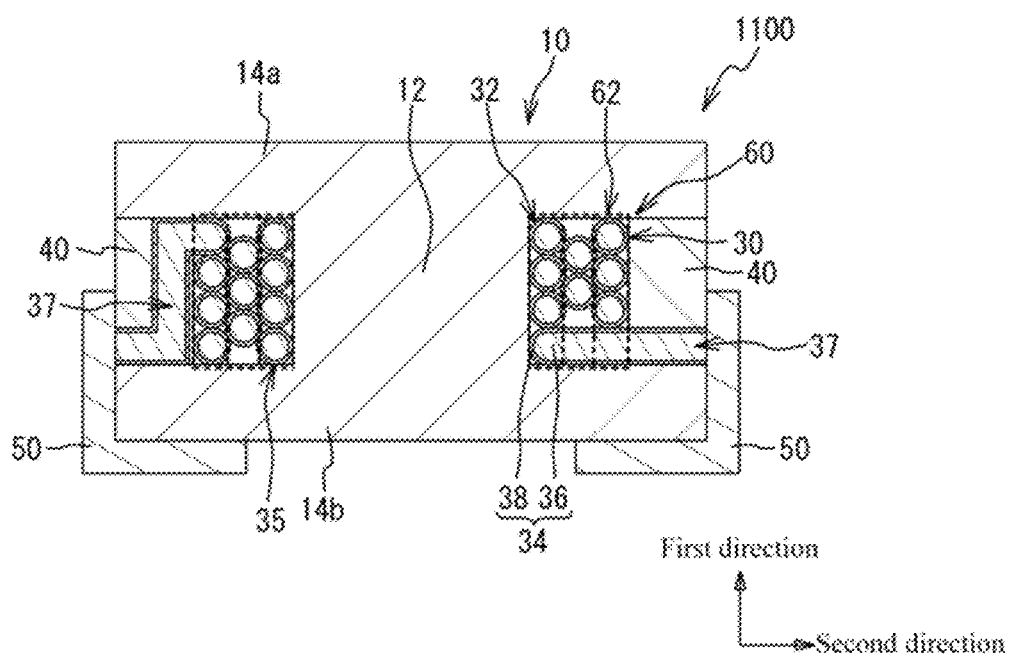

FIGS. 8A and 8B are cross-sectional views of the coil components pertaining to Comparative Examples 3 and 4, respectively. FIGS. 9A and 9B are cross-sectional views of the coil components pertaining to Comparative Examples 5 and 6, respectively. As shown in FIG. 8A, the coil component 800 in Comparative Example 3 is such that its conductive wire 34 is a rectangular wire and both lead parts 37 are led out to the external electrodes 50 from the outermost periphery part of the wound part 35 (alpha-wound rectangular wire). The wound part 35 and lead parts 37, which are included in the coil 30, are in contact with the flange parts 14a, 14b in each of one or more layers 32 because no void is formed between those parts and the flange parts 14a, 14b. As shown in FIG. 8B, the coil component 900 in Comparative Example 4 is such that its conductive wire 34 is a round wire and both lead parts 37 are led out to the external electrodes 50 from the outermost periphery part of the wound part 35 (alpha-wound round wire), as opposed to the coil component 800 in Comparative Example 3 where the conductive wire 34 is a rectangular wire and both lead parts 37 are led out to the external electrodes 50 from the outermost periphery part of the wound part 35 (alpha-wound rectangular wire). The remaining constitutions are the same as those in Comparative Example 3, and therefore not explained.

As shown in FIG. 9A, the coil component 1000 in Comparative Example 5 is such that its conductive wire 34 is a rectangular wire and one of the lead parts 37 is led out from the innermost periphery part of the wound part 35, while the other is led out from the outermost periphery part of the wound part 35, to the external electrodes 50, respectively. The remaining constitutions are the same as those in Comparative Example 3, and therefore not explained. As shown in FIG. 9B, the coil component 1100 in Comparative Example 6 is such that its conductive wire 34 is a round wire and one of the lead parts 37 is led out from the innermost periphery part of the wound part 35, while the other is led out from the outermost periphery part of the wound part 35, to the external electrodes 50, respectively. The wound part 35 and lead parts 37 each have a part in contact with the flange part 14a or 14b in one or more layers 32. The remaining constitutions are the same as those in Comparative Example 3, and therefore not explained.

In Comparative Examples 3 to 5, the wound part 35 and lead parts 37 have no void formed between them and the flange part 14a or 14b in each of one or more layers 32, while in Comparative Example 6, the wound part 35 and lead parts 37 each have a part having no void formed between it and the flange part 14a or 14b in one or more layers 32. As a result, Comparative Examples 3 to 6 may generate cracks in the flange parts 14a, 14b due to thermal expansion of the conductive wire 34. In Example 4 through Variation Example 3 of Example 4, on the other hand, the wound part 35 and at least one of the lead parts 37 are in contact with the void 64 formed between them and the flange part 14a or 14b in each of one or more layers 32, and therefore generation of cracks in the flange parts 14a, 14b can be reduced even when the conductive wire 34 undergoes thermal expansion.

Example 4 through Variation Example 3 of Example 4 illustrated examples where the wound part 35 and at least one of the lead parts 37 were in contact with the void 64; however, they may be in contact with the void 64a shown in FIG. 3B. Also, in Example 4 through Variation Example 3 of Example 4, the void 66 shown in FIG. 4 may be formed between the coil 30 including the wound part 35 and lead parts 37, and the winding shaft 12, or the void 68 shown in FIG. 5 may be formed between the wound part 35 and the exterior resin 40, with the wound part 35 and at least one of the lead parts 37 in contact with the void 68.

Example 5

Figure 10:
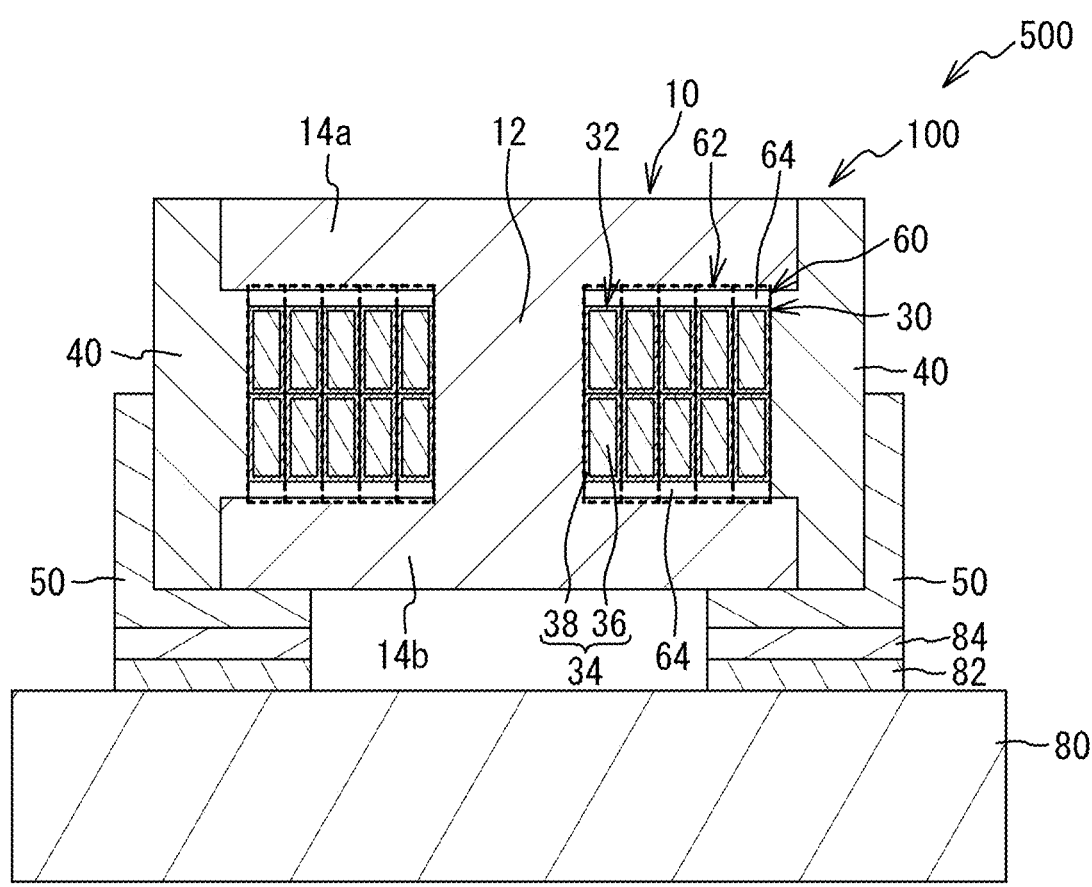
FIG. 10 is a cross-sectional view of the electronic device pertaining to Example 5.

FIG. 10 is a cross-sectional view of the electronic device pertaining to Example 5. As shown in FIG. 10, the electronic device 500 in Example 5 comprises a circuit board 80 and the coil component 100 in Example 1 being mounted on the circuit board 80. The coil component 100 is mounted on the circuit board 80 as a result of the external electrodes 50 joined to the electrodes 82 on the circuit board 80 via a solder 84.

According to Example 5, where the coil component 100 in Example 1 is mounted on the circuit board 80, generation of cracks in the drum core 10 can be reduced even when the temperature of the coil component 100 becomes high due to the use environment of the electronic device 500, for example. It should be noted that, while Example 5 illustrated an example where the coil component 100 in Example 1 was mounted on the circuit board 80, the coil component in any of Variation Example 1 of Example 1 through Variation Example 3 of Example 4 may be mounted.

The foregoing described the examples of the present invention in detail; however, the present invention is not limited to these specific examples, and various modifications and changes can be made so long as doing so does not deviate from the key points of the present invention described in "What Is Claimed Is."

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2017-231771, filed Dec. 1, 2017, and No. 2018-124047, filed Jun. 29, 2018, the disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A coil component comprising:
a drum core having a winding shaft and a pair of flange parts provided at both ends of the winding shaft in an axial direction; and;
a coil constituted by a conductive wire with insulating sheath being wound around the winding shaft, forming one or more layers each extending outwardly from a part at the winding shaft in a direction which crosses the axial direction;
wherein,
the conductive wire is exposed to and faces, in the axial direction, a first void formed between the pair of flange parts and extending outwardly from a part at the winding shaft in the direction which crosses the axial direction, wherein the first void is present along the one or more layers in succession in the direction which crosses the axial direction from one end to an other end of the conductive wire, and a thickness of the first void in the axial direction is greater than a thickness of the insulating sheath.

2. The coil component according to claim 1, wherein the drum core is constituted by a soft magnetic metal body.

3. The coil component according to claim 1, wherein the first void is provided between the conductive wire and at least one of the pair of flange parts.

4. The coil component according to claim 1, wherein:
the conductive wire is wound multiple turns around the winding shaft and arranged side by side in the axial direction; and
the first void is provided between parts of the conductive wire arranged next to each other in the axial direction.

5. The coil component according to claim 1, wherein a second void is provided between the coil and the winding shaft.

6. The coil component according to claim 1, wherein:
the drum core is formed by a magnetic metal; and
the pair of flange parts each have a thickness of 0.18 mm or less.

7. The coil component according to claim 1, wherein:
the coil includes a wound part where the conductive wire is wound around the winding shaft to form the one or more layers, and lead parts where the conductive wire is led out to external electrodes from the wound part; and
the wound part and at least one of the lead parts are in contact, in each of the one or more layers, with the first void formed in the axial direction with respect to the conductive wire.

8. An electronic device, comprising the coil component according to claim 1, and a circuit board on which the coil component is mounted.

9. The coil component according to claim 1, wherein an exterior resin is provided in a manner joining to opposing faces of the pair of flange parts at edges of the pair of flange parts, while also surrounding an outer periphery of the coil.

10. The coil component according to claim 9, wherein the exterior resin is joined to the opposing faces of the pair of flange parts and also to side faces of the pair of flange parts.

11. The coil component according to claim 9, wherein a third void is provided between the coil and the exterior resin.

* * * * *